United States Patent
Bachmann

(10) Patent No.: US 9,318,280 B2
(45) Date of Patent: Apr. 19, 2016

(54) CONTACTLESS SWITCH

(71) Applicant: Contelec AG, Biel/Bienne (CH)

(72) Inventor: Rolf Bachmann, Busswil BE (CH)

(73) Assignee: Contelec AG, Biel/Bienne (CH)

( * ) Notice: Subject to any disclaimer, the term of this patent is extended or adjusted under 35 U.S.C. 154(b) by 0 days.

(21) Appl. No.: 14/497,519

(22) Filed: Sep. 26, 2014

(65) Prior Publication Data

US 2015/0091679 A1  Apr. 2, 2015

(30) Foreign Application Priority Data

Sep. 27, 2013 (EP) ..................................... 13004691

(51) Int. Cl.
 *H01H 13/14* (2006.01)
 *H03K 17/95* (2006.01)
 *H03K 17/97* (2006.01)

(52) U.S. Cl.
 CPC ........... *H01H 13/14* (2013.01); *H03K 17/9505* (2013.01); *H03K 17/9517* (2013.01); *H03K 17/97* (2013.01); *H03K 2017/9507* (2013.01); *H03K 2217/96042* (2013.01); *H03K 2217/9653* (2013.01)

(58) Field of Classification Search
 CPC .......... H03K 17/9505; H03K 17/9517; H03K 17/97; H03K 2017/9507; H03K 2217/96042; H03K 2217/9653; H01H 3/12; H01H 13/00; H01H 13/14; H01H 25/065
 See application file for complete search history.

(56) References Cited

U.S. PATENT DOCUMENTS

| 3,360,627 | A | * | 12/1967 | Wessel | ..................... | G05G 1/02 |
| | | | | | | 200/302.2 |
| 5,977,888 | A | * | 11/1999 | Fujita | ................... | H01H 13/705 |
| | | | | | | 200/12 |
| 6,008,460 | A | | 12/1999 | Demari | | |
| 6,873,233 | B2 | * | 3/2005 | Sugiyama | ............ | B60Q 1/1469 |
| | | | | | | 335/205 |
| 2007/0219409 | A1 | * | 9/2007 | Shimizu | ............. | A61B 1/00039 |
| | | | | | | 600/112 |
| 2010/0025216 | A1 | * | 2/2010 | Huang | ..................... | H01H 5/02 |
| | | | | | | 200/522 |
| 2012/0326817 | A1 | * | 12/2012 | Kayama | ............... | H01H 25/065 |
| | | | | | | 335/207 |

FOREIGN PATENT DOCUMENTS

| CH | 706043 A1 | * | 7/2013 | ............. G01D 5/145 |
| DE | 29905431 U1 | * | 6/1999 | |
| DE | 102 41 642 A1 | | 3/2004 | |
| DE | 10 2009 053676 B3 | | 2/2011 | |
| DE | 10 2010 002109 A1 | | 8/2011 | |
| EP | 0 841 674 B1 | | 5/1998 | |
| EP | 1 270 328 A2 | | 1/2003 | |
| GB | 1062504 A | * | 3/1967 | ............. H01H 13/06 |
| GB | 1412510 A | * | 11/1975 | ............. H03K 17/90 |
| WO | WO 2009063799 A1 | * | 5/2009 | ............. G06F 3/0338 |

OTHER PUBLICATIONS

European Search Report in 13004691.5, dated Feb. 21, 2014.

* cited by examiner

*Primary Examiner* — Mohamad Musleh
(74) *Attorney, Agent, or Firm* — Collard & Roe, P.C.

(57) ABSTRACT

A switch includes a button which is connected to a ring-shaped permanent magnet that is magnetized along a z-axis, a guide member made from an non-ferromagnetic material inside which the button and the ring-shaped permanent magnet are arranged so as to be moveable along the z-axis, as well as at least one sensor that has a sensitive area that is arranged inside the ring-shaped permanent magnet and that is configured to measure a change in a magnetic field in the radial direction within a x-y-plane, wherein the x-axis and the y-axis lie orthogonally to the z-axis, respectively.

10 Claims, 2 Drawing Sheets

CONTACTLESS SWITCH

CROSS REFERENCE TO RELATED APPLICATIONS

Applicant claims priority under 35 U.S.C. §119 of European Application No. 13004691.5 filed Sep. 27, 2013, the disclosure of which is incorporated by reference.

BACKGROUND OF THE INVENTION

1. Field of the Invention

The present invention relates to a contactless electric switch, particularly a switch having a magnetic reset function.

2. Description of the Related Art

What is known are electronic push-buttons or switches by which two contact zones are connected via a short-circuit piece. To achieve a safe switching process and give the operator a haptic feedback, such switches are often designed with a so-called click function. This can be realized, for example, by using a bent membrane that allows for a sudden deflection when a sufficient amount of pressure is applied to the button of the switch, with the deflection being reversible when the button is released. Such switches can be executed, for example, as a membrane keyboard having a single or multiple buttons. Such a keyboard is known from EP 0 841 674 B1.

Further it is known to provide switches with a mechanical spring system in order to facilitate resetting of the pressed button. Here, too, a mechanical contacting detects when the button is being pressed.

For so-called non-contact switches, in which the actuation of their button is detected by means of reed contacts, it is known to dispense with any mechanical contacting. In this case, the field of a permanent magnet causes the contact zones that are made of a magnetic material to touch each other and thus to establish an electrical contact. This means that a contactless actuation occurs, which, however, still involves establishing a mechanical, electrical contact.

A switch that is of a completely non-contact-type is known from DE 102 41 642 A1. Its button is made of a permanent magnet material and, in a resting position, magnetically adheres to an adhesive plate. If pressure is applied to the button, the adhesive plate can be detached and moved through an area monitored by the Hall sensors which are arranged laterally next to the button. In order to accommodate these Hall sensors, the switch is designed so as to have a great width.

The object of the present invention is to provide a compact switch that is designed in a completely non-contact way and in particular has a click-function as well as a good magnetic shielding, so that several such switches can be arranged next to each other while at the same time ensuring trouble-free operation.

SUMMARY OF THE INVENTION

This object is achieved by the switch according to the invention. It comprises a button which is connected to a ring-shaped permanent magnet that is magnetized along a z-axis. Furthermore, it comprises a guide member which is made of a non-ferromagnetic material and in which the button and the ring-shaped permanent magnet are arranged so as to be moveable along the z-axis. Moreover, it comprises at least one sensor which has a sensitive area that is arranged inside the ring-shaped permanent magnet. The sensor is configured to measure a change in a magnetic field in the radial direction in a x-y-plane. The x-axis and the y-axis lie orthogonally to the z-axis, respectively. The measurement of the magnetic field is carried out in the radial direction, as—due to the ring shape of the magnet—the magnetic field lines run from and to the magnet's ring centre. During the actuation of the button, the at least one sensor can convert the change in the magnetic field generated by the ring-shaped permanent magnet into an electric signal. This allows for a contactless measurement of an actuation of the button, so that the switch according to the invention is not subject to wear and tear. The arrangement of the sensitive area of the sensor inside the ring-shaped permanent magnet results in an extremely compact switch design. At the same time, a movement of the ring-shaped permanent magnet can be determined with extreme accuracy in this manner. Due to the polarization of the ring-shaped permanent magnet in the z-direction, the change in the strength of the magnetic field at the sensor during the actuation of the button is linear only if it is measured in the xy-plane. This makes it possible for the sensor to output a linear electric signal as the button is being actuated.

To allow for an easier operation of the button, it can be connected to a control element.

The ring-shaped permanent magnet is preferably surrounded by a ring-shaped shielding element that is made of a ferromagnetic material and is connected to the same. This results in an inward as well as outward magnetic shielding of the switch, so that its functionality can neither be compromised by external magnetic fields nor can the magnetic field of the permanent magnet interfere with the functionality of other electronic devices arranged close to the switch. As the ring-shaped shielding element, thanks to its connection with the ring-shaped permanent magnet, can be moved together with it along the z-axis, a reliable magnetic shielding is made possible without having to cover the entire guide member with a magnetically shielding material.

The dimensions of the shielding element are preferably chosen in such a way that the magnetic field of the ring-shaped permanent magnet does not cause any magnetic saturation therein.

Further, the switch preferably comprises a flux concentrator made from a ferromagnetic material that has an opening through which the button is guided along the z-axis. What is referred to by a flux concentrator or a flux conductor according to the invention is a structural component that concentrates within itself or conducts the magnetic flux of the magnetic field of the ring-shaped permanent magnet that is acting thereon. The flux concentrator preferably has a magnetic permeability μ of more than 300 H/m. Its magnetic coercive field strength is preferably less than 1000 A/m. Further, it is preferred if the flux concentrator's dimensions are chosen in such a way that the magnetic field of the ring-shaped permanent magnet does not cause magnetic saturation therein.

The flux concentrator is preferably arranged in such a way that the shielding element magnetically adheres to the flux concentrator in a basic position of the switch and that in an actuation position of the switch in which a force is acting on the button along the z-axis in the direction of the at least one sensor the shielding element is detached from the flux concentrator, and that the button, the ring-shaped magnet and the shielding element are shifted with respect to the basic position along the z-axis, in the direction of the at least one sensor. Thus, an operator has to apply a certain minimal amount of force when pressing the button of the switch so as to separate the shielding element from the flux concentrator. Thus, a click effect is created which provides a haptic feedback to the operator regarding the actuation of the switch. As the expenditure of a sufficiently strong force results in the button promptly moving away from the flux concentrator, no bouncing of the switch can occur.

In a particularly preferred case, the magnetic reset force of the ring-shaped magnet is so high that the switch, without any application of force on the button, automatically returns from its actuation position to its basic position. For this purpose, the permanent magnet preferably consists of a NdFeB alloy, particularly one having a saturation flux density Bs that lies in the range of 1.0 to 1.4 T, or of a SmCo alloy, particularly one having a saturation flux density Bs that lies in the range of 0.9 to 1.2 T. In a particularly preferred case, the permanent magnet consists of a plastic-bonded NdFeB alloy, particularly one having a saturation flux density Bs of 670 mT. In this way, it becomes possible to dispense with a spring system for resetting the button to its initial position.

The guide member preferably has a stop collar which limits the maximal deflection of the shielding element along the z-axis in the direction of the at least one sensor. Hereby it may particularly be ensured that the button cannot be deflected so far that it no longer automatically returns to its basic position. In addition, any contact between the button and the sensor can be avoided in this way.

The stop collar can be formed as an integral part of the guide. However, it can also be realized as a separate structural component. Preferably it is a circuit board. In this way, it particularly becomes possible to arrange at least one light source, preferably at least one LED, on the circuit board. When the button is made of a transparent or translucent material, the light of the light source shines through the internal space of the ring-shaped permanent magnet and through the button, so that it may be perceived even in a dark environment. For this purpose, the light source is preferably arranged below the internal space of the ring-shaped permanent magnet, so that the light can illuminate the button in a direction perpendicular to the circuit board.

The at least one sensor is preferably a measuring element, in which the magnetoresistive effect or the Hall effect is made use of. In a particularly preferred case it is a Hall element. In an even more preferred case it is a programmable Hall element, so that the change of the magnetic field can be output in the radial direction in a x-y-plane as a switching signal.

Further, it is preferred for the switch to have at least two sensors. This allows for redundancy in the determination of the button deflection, so that the switch becomes less prone to errors.

BRIEF DESCRIPTION OF THE DRAWINGS

Exemplary embodiments of the invention are shown in the drawings and are elaborated on in more detail in the following descriptions.

DETAILED DESCRIPTION OF THE PREFERRED EMBODIMENTS

Figure 1:
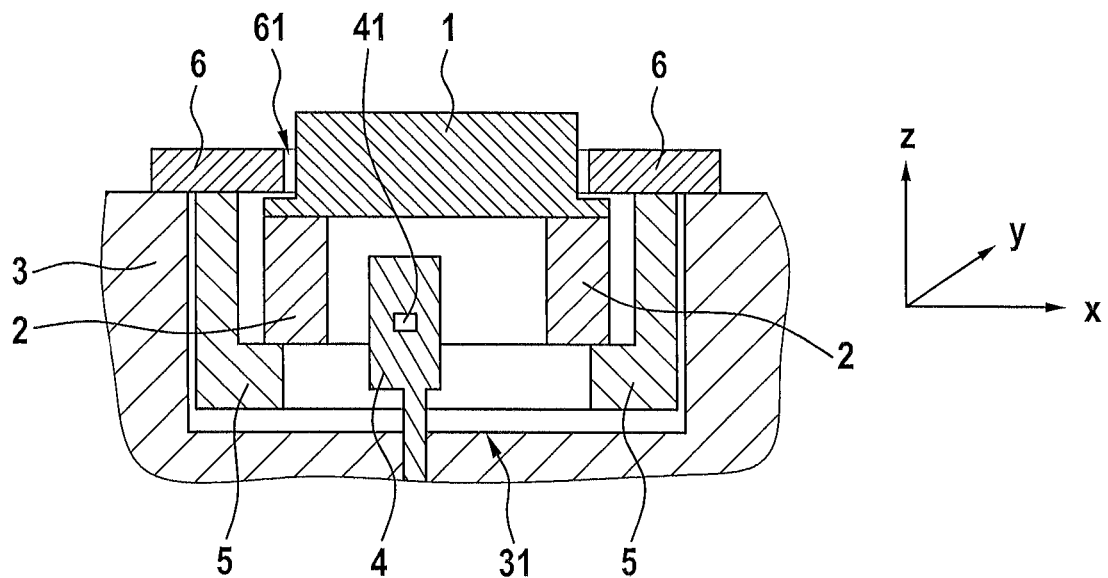
FIG. 1 shows a cross-sectional diagram of a switch according to one embodiment of the invention in a basic position.
Figure 2:
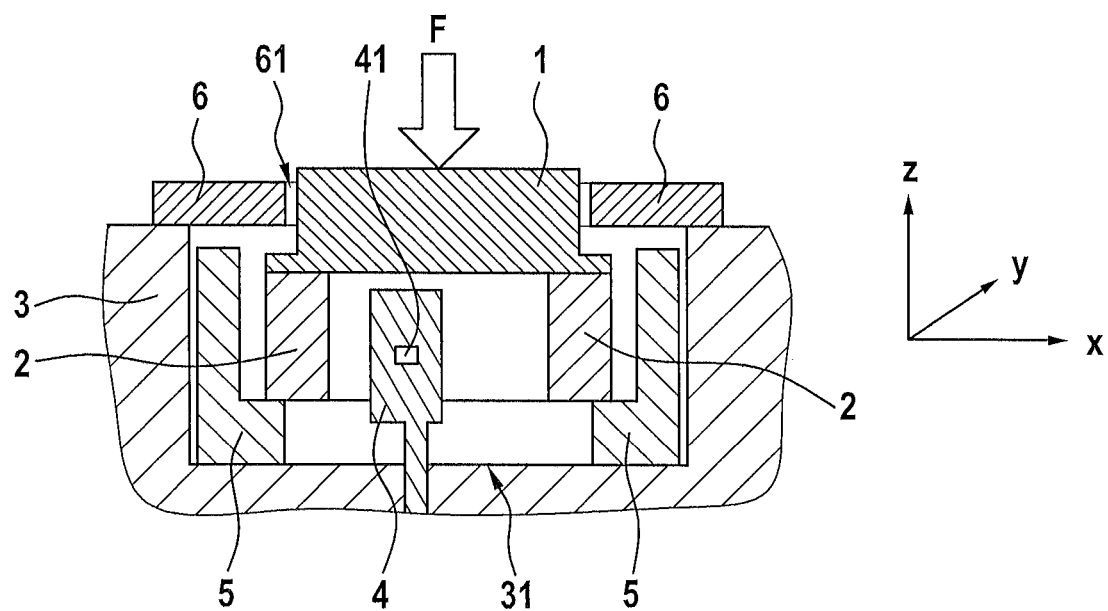
FIG. 2 shows a cross-sectional diagram of a switch according to one embodiment of the invention in an actuation position.

A switch according to a first embodiment of the invention is shown in FIG. 1 in a schematic cross-sectional diagram. A button 1 is used for the actuation of the switch by an operator. It is attached to a ring-shaped permanent magnet 2 made of a plastic-bonded NdFeB alloy. The permanent magnet 2 has an internal diameter of 5 mm, an external diameter of 8.0 mm and a length of 2.5 mm. The ring-shaped permanent magnet 2 is arranged inside a cup-shaped housing made from a plastic material which serves as the guide member 3. A Hall element 4 is arranged in this housing in such a way that its sensitive area 41 is located within the internal space of the ring-shaped permanent magnet 2. The legs of the Hall element 4 are guided through the base of the housing, so that the Hall element 4 can be electrically contacted from the outside. The ring-shaped permanent magnet 2 is arranged inside a ring-shaped shielding element 5 having a length of 4.5 mm, which is done in such a way that the shielding element 5 is protruding at the top as well as at the bottom to project beyond the ring-shaped permanent magnet 2. The shielding element 5 has an external diameter of 10.5 mm and is guided at the interior walls of the guide member 3. The internal diameter of the shielding element 5 decreases at the bottom side of the ring-shaped permanent magnet 2, so that in this location the ring-shaped permanent magnet 2 is supported by the shielding element 5. The ring-shaped permanent magnet 2 and the shielding element 5 are connected to each other at this support surface. The cup-shaped guide member 3 is sealed at its upper side by a disc-shaped flux concentrator 6 made of magnetically soft sheet steel. The flux concentrator 6 has a continuous opening 61 in its centre through which the button 1 is guided. Thus, actuation of the button 1 from the upper side of the switch is facilitated. In the basic position of the switch which is shown in FIG. 1, the shielding element 5 is magnetically attached to the flux concentrator 6.

When a force F is applied to the button 1 by an operator, the button 1 can release the shielding element 5 from the flux concentrator 6 and thus move the button 1, the ring-shaped permanent magnet 2 as well as the shielding element 5 by a distance of 0.5 mm along the z-axis of the switch in a downward direction. In the beginning of this movement, the operator receives a haptic feedback through the release of the connection between the shielding element 5 and the flux concentrator 6. The downward movement of the button 1, the ring-shaped permanent magnet 2 and the shielding element 5 is limited as the shielding element 5 hits the base of the guide member 3. Thus, this base serves as a stop collar 31. As the operator releases the button 1, due to the magnetic field lines of the ring-shaped permanent magnet 2 which are running through the shielding element 5, the shielding element 5 moves upwards in the direction of the flux concentrator 6 until it adheres to it again, and thus the switch is being returned to its basic position which is shown in FIG. 1. Actuating and releasing the button 1 respectively lead to a movement of the ring-shaped permanent magnet 2 along the z-axis of the switch and thus cause a change in the magnetic field that is measured by the Hall element 4 in the xy-plane. The information regarding this change can be passed on by the Hall element 4 in the form of an electric signal, which, when it is analyzed, makes it possible to detect in which position the switch is located.

Figure 3:
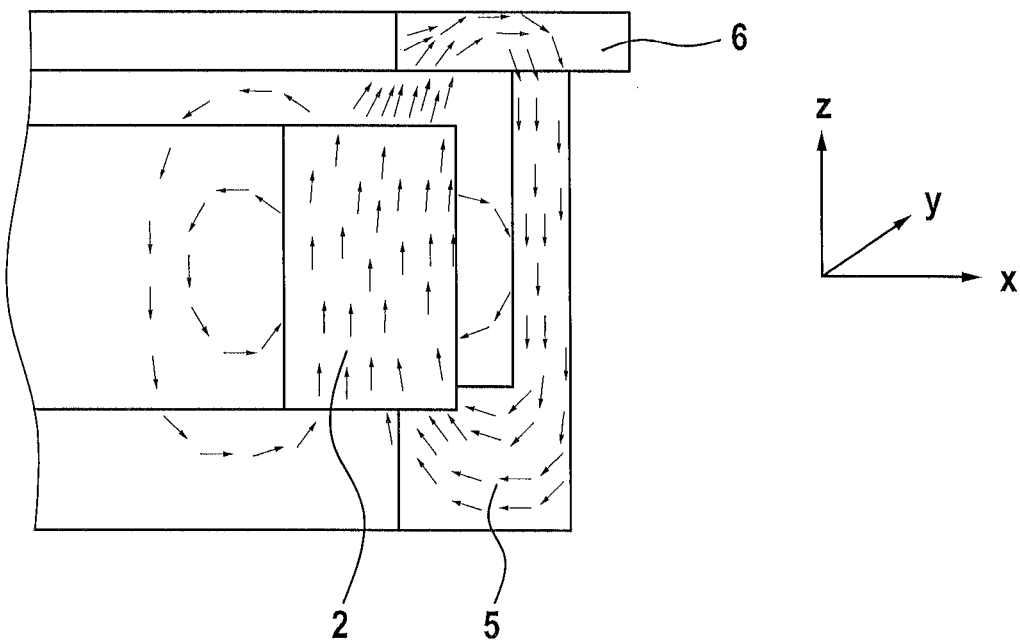
FIG. 3 shows the course of magnetic field lines in a cross-sectional diagram of a switch according to one embodiment of the invention.

FIG. 3 shows the course of the magnetic field lines within the ferromagnetic parts of the switch and within the ring-shaped magnet 2 when the switch is located in its basic position as shown in FIG. 1. Because the ring-shaped permanent magnet 2 is magnetized along the z-axis, the field lines follow the shortest path, which means that they emerge from the upper side of the ring-shaped permanent magnet 2 and run through the air gap between the button 1 and the flux concentrator 6 into the flux concentrator 6, through the shielding element 5 and from there to the second magnetic pole of the ring-shaped permanent magnet 2 located at its bottom side. Due to the magnetic flux, the shielding element 5 adheres to the bottom side of the flux concentrator 6.

Figure 4:
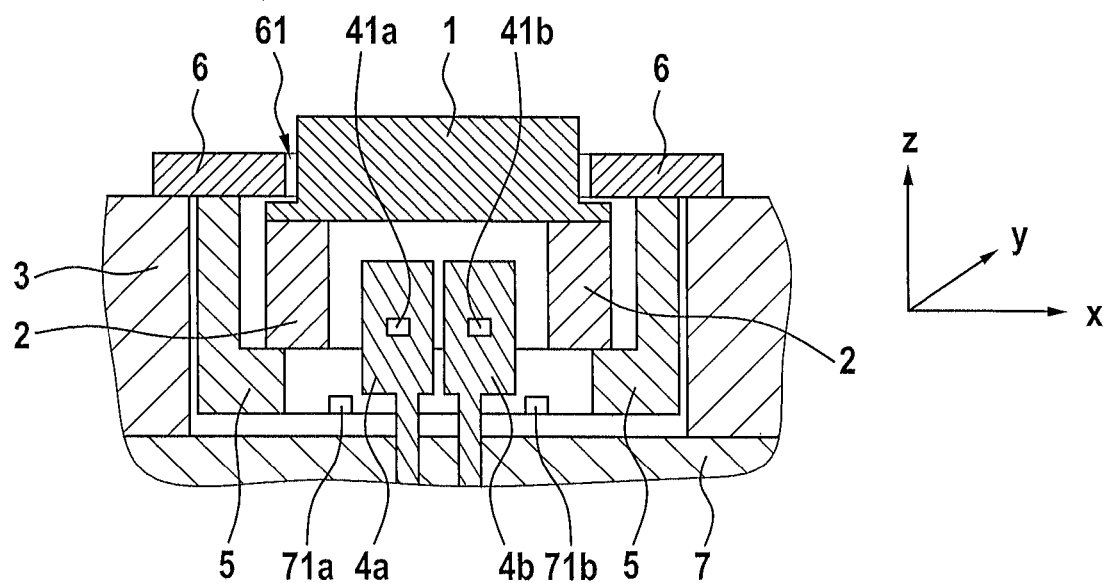
FIG. 4 shows a cross-sectional diagram of a switch according to another embodiment of the invention in a basic position.

In a second embodiment of the switch according to the invention which is shown in FIG. 4, the single Hall element 4 is replaced by two Hall elements 4a, 4b, which have a sensitive area 41a, 41b, respectively. Thus, a redundant measurement of the change in the magnetic field in the radial direction in the x-y-plane becomes possible, by which the reliability of the switch according to the invention is increased. Instead of the cup-shaped housing, a ring-shaped housing is used as the guide member 3. A circuit board 7 serves as a stop collar for the shielding element 5. On the circuit board 7, two LEDs 71a, 71b are arranged blow the internal spaces of the ring-shaped permanent magnet 2. The button 1 is made of a translucent plastic material. This allows for the illumination of the button. Switches according to the second embodiment of the invention can be operated even in a dark environment.

What is claimed is:

1. Switch, comprising
    a button which is connected to a ring-shaped permanent magnet that is magnetized along a z-axis,
    a guide member made from a non-ferromagnetic material inside which the button and the ring-shaped permanent magnet are arranged in such a manner as to be moveable along the z-axis,
    at least one sensor that has a sensitive area which is arranged inside the ring-shaped permanent magnet and that is configured to measure a change in a magnetic field in the radial direction of a x-y-plane, wherein the x-axis and the y-axis lie orthogonally to the z-axis, respectively, and
    a flux concentrator that is made from a ferromagnetic material and has an opening through which the button is guided along the z-axis,
    wherein the ring-shaped permanent magnet is surrounded by a ring-shaped shielding element made from a ferromagnetic material, and
    wherein the ring-shaped permanent magnet is connected to the ring-shaped shielding material.

2. Switch according to claim 1, wherein the dimensions of the shielding element are chosen in such a way that the magnetic field of the ring-shaped permanent magnet does not cause any magnetic saturation therein.

3. Switch according to claim 1, wherein the dimensions of the flux concentrator are chosen in such a way that the magnetic field of the ring-shaped permanent magnet does not cause any magnetic saturation therein.

4. Switch according to claim 1, wherein the flux concentrator is arranged in such a way that
    in a basic position of the switch, the shielding element magnetically adheres to the flux concentrator, and
    in an actuation position of the switch, in which a force is applied to the button along the z-axis in the direction of the at least one sensor, the shielding element is detached from the flux concentrator and the button, the ring-shaped magnet as well as the shielding element are shifted with regard to the basic position along the z-axis in the direction of the at least one sensor.

5. Switch according to claim 4, wherein the magnetic reset force of the ring-shaped magnet is so high, that the switch automatically returns from its actuation position to its basic position without any force being applied to the button.

6. Switch according to claim 1, wherein the guide member has a stop collar that limits the maximal deflection of the shielding element along the z-axis in the direction of the at least one sensor.

7. Switch according to claim 6, wherein the stop collar is a circuit board.

8. Switch according to claim 7, wherein the at least one light source, is arranged on the circuit board.

9. Switch according to claim 1, wherein the at least one sensor is a Hall element.

10. Switch according to claim 1, wherein it has at least two sensors.

* * * * *